United States Patent [19]
Van Den Berg

[11] Patent Number: 6,031,372
[45] Date of Patent: Feb. 29, 2000

[54] MAGNETIZING ARRANGEMENT FOR A MAGNETO-RESISTIVE THIN-FILM SENSOR ELEMENT WITH A BIAS LAYER PART

[75] Inventor: Hugo Van Den Berg, Herzogenaurach, Germany

[73] Assignee: Siemens AG, Munich, Germany

[21] Appl. No.: 08/973,014

[22] PCT Filed: May 31, 1996

[86] PCT No.: PCT/DE96/00961

§ 371 Date: Mar. 10, 1998

§ 102(e) Date: Mar. 10, 1998

[87] PCT Pub. No.: WO96/38738

PCT Pub. Date: Dec. 5, 1996

[30] Foreign Application Priority Data

Jun. 1, 1995 [DE] Germany ............... 195 20 172

[51] Int. Cl.[7] .............. G01R 33/09; H01L 43/08
[52] U.S. Cl. .......................... 324/252; 338/32 R
[58] Field of Search .............. 324/117 R, 207.21, 324/249, 252; 338/32 R; 360/113

[56] References Cited

U.S. PATENT DOCUMENTS

| | | | |
|---|---|---|---|
| 4,523,243 | 6/1985 | Billington | 360/113 |
| 4,533,872 | 8/1985 | Boord et al. | 324/252 |
| 4,638,280 | 1/1987 | Steingroever et al. | 335/284 |
| 4,734,644 | 3/1988 | Imakoshi et al. | 324/252 |
| 5,247,278 | 9/1993 | Pant et al. | 338/32 R |
| 5,312,644 | 5/1994 | Schwarz et al. | 427/130 |
| 5,500,590 | 3/1996 | Pant | 324/252 |
| 5,561,366 | 10/1996 | Takahashi et al. | 324/252 X |
| 5,650,887 | 7/1997 | Dovek et al. | 324/252 X |

FOREIGN PATENT DOCUMENTS

| | | |
|---|---|---|
| 346 817 | 12/1989 | European Pat. Off. . |
| 483 373 | 5/1992 | European Pat. Off. . |
| 2113650 | 5/1972 | France . |
| 42 32 244 | 3/1994 | Germany . |
| 42 43 357 | 6/1994 | Germany . |
| 94/15223 | 7/1994 | WIPO . |

OTHER PUBLICATIONS

B. G. Casner, "Wire–Wound Fixture for Magnetizing Ferrite Carriers", Western Electric Technical Digest, No. 3, Jan. 1994, pp. 23–24.

*Primary Examiner*—Gerard Strecker
*Attorney, Agent, or Firm*—Kenyon & Kenyon

[57] ABSTRACT

Using a device (7) the magnetization distribution of the bias layer part (3) of a sensor element (E) is set. The sensor element has a thin-film structure (S) on a substrate (2) and has an increased magneto-resistive effect. The device (7) has an electrically conducting conductor part (L) and devices for positioning the conductor part (7) with regard to the sensor element (E). A predetermined setting current ($I_e$) is carried over the conductor part (L), so the predetermined magnetization distribution can be set in a fixed manner in the bias layer part (3) of the sensor element (E).

19 Claims, 4 Drawing Sheets

MAGNETIZING ARRANGEMENT FOR A MAGNETO-RESISTIVE THIN-FILM SENSOR ELEMENT WITH A BIAS LAYER PART

FIELD OF THE INVENTION

The present invention relates to a device with magnetic field-generating means for fixed setting of a predetermined magnetization distribution in the bias layer part of a sensor element that is designed with a thin-film structure on a substrate and has an increased magneto-resistive effect.

BACKGROUND OF THE INVENTION

International Patent Publication No. WO 94/15223 describes a magnetizing device for providing a predetermined magnetization distribution.

A dependence of the electric resistance on the intensity and direction of a magnetic field permeating a material layer may be manifested in layers of ferromagnetic transition metals such as Ni, Fe or Co and their alloys. The effect that occurs with such layers is called anisotropic magnetoresistance "AMR" or anisotropic magneto-resistive effect. The anisotropic magneto-resistive effect is based physically on the different scattering cross sections of electrons with different spin and on the spin polarity of the D band. The electrons are referred to as majority or minority electrons respectively. For corresponding magneto-resistive sensors, a thin film of such a magneto-resistive material is generally provided with magnetization in the plane of the layer. The change in resistance with the rotation of the magnetization with regard to the direction of a current flowing through the magneto-resistive material can amount to several percent of the normal isotropic (=ohmic) resistance.

Furthermore, for some time there have been known magneto-resistive multi-layer systems which contain a plurality of ferromagnetic layers arranged in a stack and separated from each other by metal interlayers, with the magnetization of each layer in the plane of the layer. The chosen thickness of each individual layer is much smaller than the mean free path length of the conduction electrons. In addition to the above-mentioned anisotropic magneto-resistive effect, AMR, such multiple-layer systems may also manifest a giant magneto-resistive effect or giant magneto-resistance, GMR (see, for example, European Patent No. 483,373). The GMR effect is based on the difference in scattering of the majority and minority conduction electrons at the interfaces between the ferromagnetic layers and the adjacent interlayers and on the scattering effects within the layers, in particular when using alloys. The GMR effect is an isotropic effect. The GMR effect can be much greater than the anisotropic effect, AMR, and may assume values up to 70% of the regular isotropic resistance. In corresponding multi-layer systems having a GMR effect, neighboring metallic magnetic layers are at first oppositely magnetized, with one bias layer or bias layer part being magnetically harder than a measurement layer. Under the influence of an external magnetic field, the initial antiparallel orientation of the magnetizations may then be converted to a parallel orientation. This fact is utilized with appropriate magnetic field sensors.

With such magneto-resistive sensor elements with a bias layer part, the required fixed orientation direction of the magnetizations in the respective bias layer part is generally set by introducing the sensor element into a magnetic field of sufficient field strength generated by an electromagnet. If several sensor elements are to be suitably magnetized at the same time for technical manufacturing reasons, this is possible in only a single direction, namely in the direction determined by the field of the magnet.

SUMMARY OF THE INVENTION

An object of the present invention is to provide a magnetizing device with which the orientation of the magnetization of the bias layer part of a thin-film sensor element having an increased magneto-resistive effect can be set in a relatively simple manner. The device should also be designed so that multiple sensor arrangements in any desired arrangement can be magnetized at the same time on a small scale, in particular also with different directions of the setting field, optionally with alternating directions.

The aforementioned object is achieved with a magnetizing device including an electrically conducting conductor part, means for positioning the conductor part with regard to the sensor element and devices for carrying a predetermined set current over the conductor part in such a way as to generate at least a part of a magnetic field by means of which the predetermined magnetization distribution can be set in a fixed manner in the bias layer part of the respective sensor element.

Magnetization distribution refers to the magnetization of a single layer in a predetermined direction or of a plurality of layers in the same direction or in different directions.

An advantage of the present invention is that in at least one sensor element, it is relatively easy to "fix" the magnetization with a predetermined orientation in the bias layer part of the sensor element even in a tight space by means of the setting current through the conductor part assigned to the sensor element. The bias layer part may consist of a single, magnetically harder bias layer or a bias layer system which is designed in particular as an artificial antiferromagnet (see International Patent Publication No. WO 94/15223). The magnetization of several layers forming a bias layer part may be different in the individual layers, resulting in a corresponding magnetization distribution. With the magnetizing device according to the present invention, the bias layer part which is magnetically harder in comparison with other magnetic layers of a sensor element is magnetized once in a predetermined orientation direction in a simple manner advantageously by means of the magnetic field induced by the respective setting current. The setting current selected should be sufficiently high to produce a magnetic field strong enough to magnetize the bias layer part. An external supporting field and/or a special auxiliary field may be superimposed on the magnetic field of the setting current. However, because of the predetermined magnetic hardness (coercive field strength) of the bias layer part, an external magnetic field component to be detected should not be capable of remagnetizing the bias layer part.

DETAILED DESCRIPTION OF THE INVENTION

The device according to the present invention is provided for setting a predetermined magnetization orientation direction in the bias layer part of at least one sensor element E. Sensor element E as shown in, e.g., FIG. 1 should be made by the thin-film technique (see, for example, European Patent No. 483,373, German Published Patent applications Nos. 42 32 244 and 42 43 357 or International Patent publications No. WO 94/15223) from an essentially known magneto-resistive multi-layer system having a GMR effect. A layer structure is understood here to mean that the sensor element has a predetermined sequence of layers with a predetermined thickness of the individual layers. Such layer sequences can be implemented easily and advantageously. Sensor element E has a bias layer part with a predetermined magnetization orientation direction. Furthermore, the sensor element E has a measurement layer that is magnetically softer than the bias layer part and is separated from this bias layer part by a non-magnetic interlayer.

Figure 1:
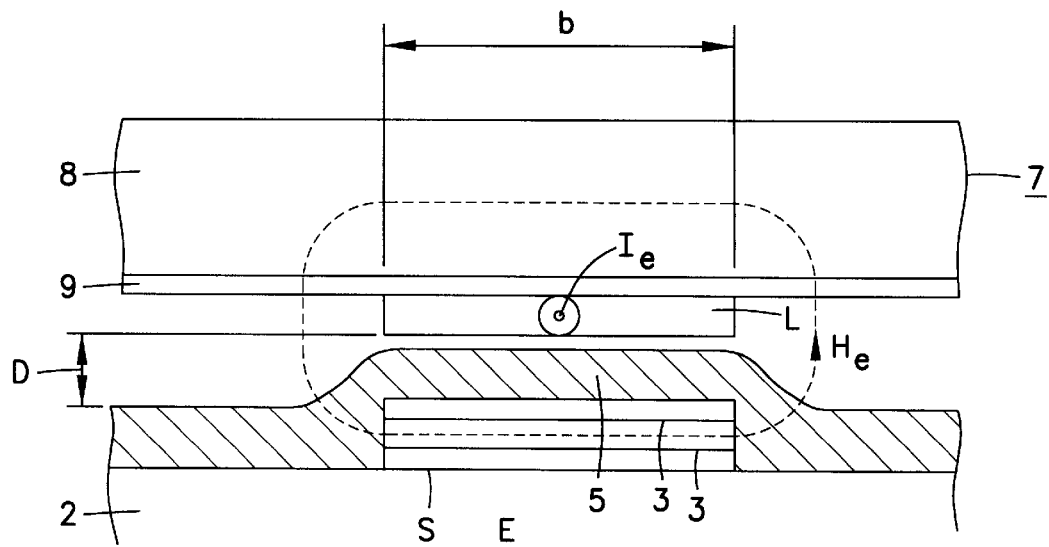
FIG. 1 shows a cross section of a magnetizing device in the area of a sensor element.

The layer system with the GMR effect may be, for example, the basic system for creating the sensor element E. Sensor element E, which is strip-shaped, for example, preferably has a number of corresponding magnetic and non-magnetic layers. The multi-layer system for sensor element E is shown in FIG. 1. The multi-layer system S, which is applied to a substrate 2 and includes, for example, a bias layer part 3 having several bias layers, is covered with a passivation layer 5 consisting of a non-magnetic material, in particular an insulating material. Sensor element E with its multi-layer system need not necessarily take up a rectangular base area on substrate 2. The sensor element E can also have, for example, a meandering form. For wiring the individual sensor element E, the GMR layer system is provided with at least two contacts. These contacts are either both arranged on the top electrically conducting layer of the magnetic field-sensitive layer system, so that a current flows parallel on the average to the planes of the layers (current-in-plane (CIP) system); or one contact is arranged on the top layer and another on the bottom layer, so that a current flows perpendicular to the planes of the layer on the average (current-perpendicular-to-plane (CPP) system). In FIG. 1 electric terminals on the multi-layer system have been omitted for simplicity.

Figure 2:
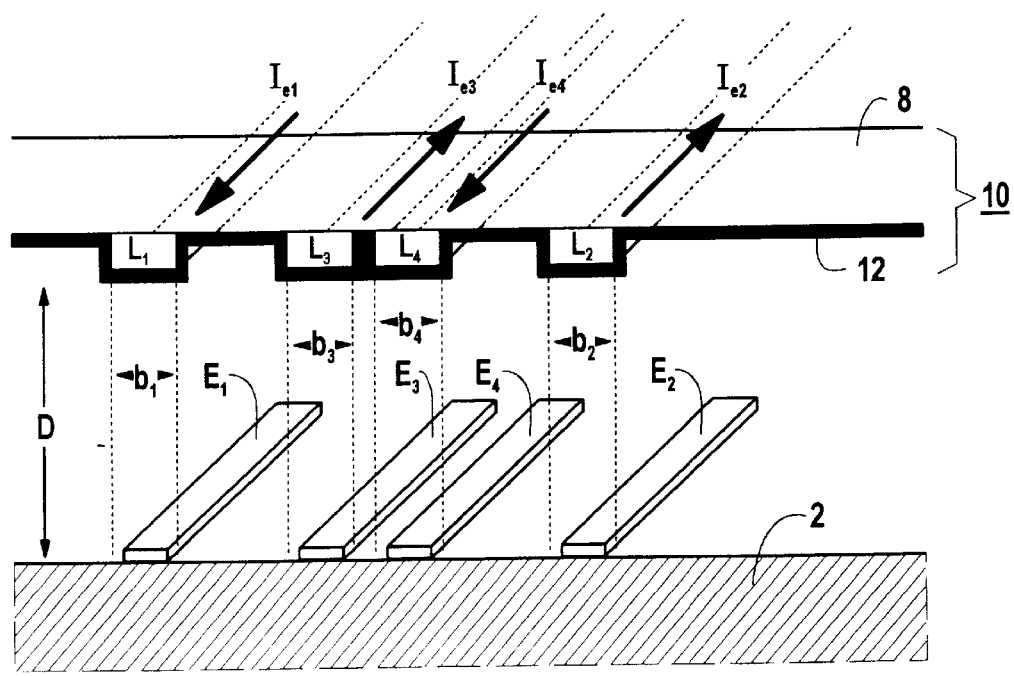
FIG. 2 shows an oblique view of a magnetizing device for multiple sensor elements.

A magnetizing device 7 according to the invention is provided for magnetization of bias layer part 3 of sensor element E with a predetermined shape of its base area and with a predetermined magnetization orientation direction. According to FIG. 1, this arrangement may have a conductor carrier 8 on whose bottom side facing the sensor element there is arranged for instance a printed conductor part L of a material having a good electric conductivity such as Cu or Ag. This conductor carrier 8 (on its bottom side which faces the sensor element E) is capable of carrying a plurality of electrical conductors $L_1$, $L_2$, $L_3$, $L_4$ which are traversed by the current (as shown in FIG. 2). Thus, at least at the bottom side, the conductor carrier 8 is composed of a material (such as an electrically insulating material) that does not permit any electrical short circuits between the conductors. Others than printed conductors or conductor parts can be provided. Afterwards a printed realization is assumed. Optionally an insulation layer 9 may be provided between conductor carrier 8 and printed conductor part L. Printed conductor part L should preferably be arranged on the side of conductor carrier 8 facing the sensor element in such a way that when carrier 8 is positioned above sensor element E, printed conductor part L preferably runs at least approximately parallel to sensor element E. Width b of the printed conductor is generally selected so it is not much greater than the width of layer system S of the respective sensor element E. However, if a printed conductor part is to run at an angle other than zero with regard to the main direction of extent of a sensor element, e.g., at a right angle, then this printed conductor part must have a width such that it can cover practically the entire area of the sensor element. With a setting current $I_e$ flowing through printed conductor part L, a setting magnetic field $H_e$ can be induced with a direction and strength so that a preferential direction of magnetization or a magnetization distribution can be set in bias layer part 3 of the respective multi-layer system S. The setting current may or may not undergo a polarity change per unit of time of the magnetization period, depending on the chosen structure of the bias layer part and the properties of the material of the selected layers. In other words, an alternating current may optionally also be provided. For the magnetization, distance D between a printed conductor part L and multi-layer system S can preferably be set to be smaller than width b of the printed conductor, because otherwise a high-amperage current $I_e$ would be required to generate magnetic fields of the strength $H_e$. In general, distance D amounts to only a few μm. Printed conductor part L may optionally also be in direct contact with sensor element E or layer 5 thereof.

In deviation from conductor carrier 8 shown in FIG. 1, other mounting devices are of course also suitable for positioning at least one conductor part on at least one respective sensor element.

The magnetizing device according to the present invention may also be designed to advantage so that several sensor elements are magnetized with it simultaneously with regard to their bias layer parts. It should be possible to arrange the sensor elements as desired in one or more planes on at least one substrate. FIG. 2 shows a corresponding embodiment. The magnetizing device, labeled there as 10 in general, is provided with four GMR multi-layer sensor elements $E_1$ through $E_4$ which are arranged side by side on a joint substrate 2, for example. Other possible arrangements may of course also be selected for the sensor elements on the substrate. A printed conductor part $L_j$ (where $1 \leq j \leq 4$) is provided for each sensor element $E_j$ on the bottom side of a conductor carrier 8 of magnetizing device 10. Printed conductor parts $L_j$ may also be provided with an insulator layer 12 to prevent short circuits between neighboring printed conductor parts. The position of the individual printed conductor parts $L_j$ on conductor carrier 8 is selected so that individual printed conductor parts $L_j$ run precisely above the respective sensor elements, maintaining a very small distance D of a few μm in general, as magnetizing device 10 approaches sensor elements $E_j$. Individual printed conductor parts $L_1$ through $L_4$ may optionally also be in several planes, so the printed conductors can intersect. They need not necessarily run parallel to their respective sensor elements. Thus, it is also possible for them to form an angle of 90°, for example, with the sensor elements. In such a case, the printed conductor parts must be designed with sufficient width. In the embodiment of the present invention shown in FIG. 2, they have the same printed conductor widths $b_1$ through $b_4$, and setting currents $I_{e1}$ through $I_{e4}$ flow through them in the directions indicated by the arrows. As shown in FIG. 2, different bias layer orientations can thus be induced to advantage in the individual sensor elements. The individual currents may have fixed or alternating polarities.

Figure 3:
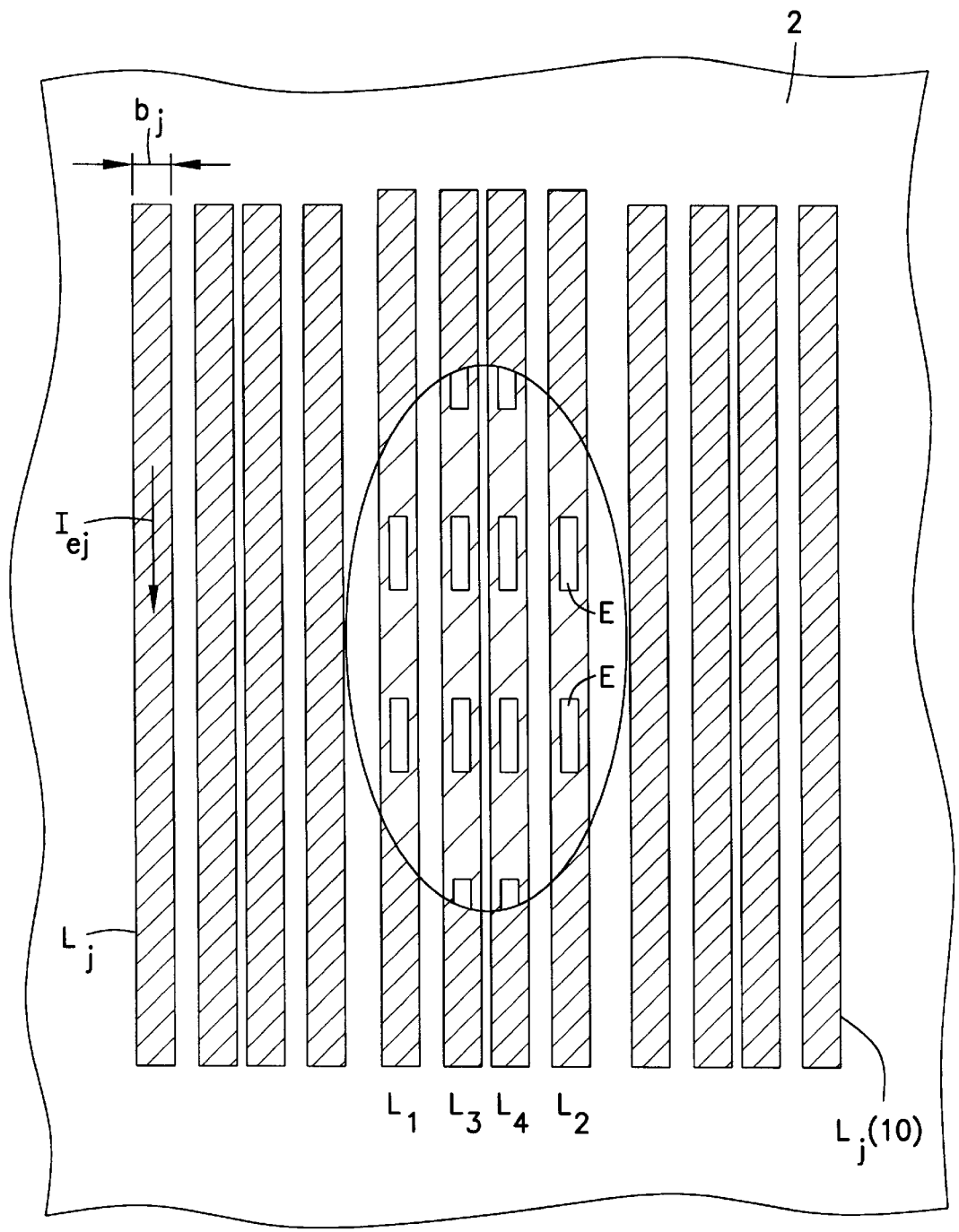
FIG. 3 shows a top view of the device of FIG. 2.

For economical manufacture, a number of individual sensor elements can be produced simultaneously to advantage on a common substrate, e.g., a silicon wafer. FIG. 3 is based on a similar embodiment. The bias layer parts of GMR sensor element $E_j$ applied to a silicon wafer substrate 2 are produced by means of sufficiently high setting currents $I_{ej}$ in the respective printed conductor parts $L_j$ or $L_1$ through $L_4$ of a magnetizing device according to this invention. Multiple printed conductor parts for multiple sensor elements may be formed by continuous printed conductors $L_j$.

The setting magnetic field $H_e$ induced by these printed conductors must be relatively high in many cases and may amount to 1 to 2 kOe, for example. The amperage per $\mu m$ of printed conductor width $b_j$ is then approximately 150 to 300 mA. For a typical printed conductor width $b_j$ of 50 $\mu m$, this yields a current $I_{ej}$ of 7 to 15 A. Such a high current can lead to a considerable heat load on the printed conductor. Therefore, the thickness of the printed conductors or their printed conductor parts $L_j$ is preferably selected to be as large as possible because, first, the resistance and thus also the heat generated are inversely proportional to the thickness and, second, thermal capacity increases in proportion to the thickness. However, industrially feasible printed conductor thicknesses are limited by the technology used. In addition, dissipation of the heat generated by the printed conductors by heat conduction over the conductor carrier is possible. The carrier should therefore be made of a material with good thermal conductivity and it should perhaps be cooled. Since the setting currents are relatively high, reliable low-resistance contacts are necessary between the printed conductors and a power supply unit. A suitable bonding or soldering of terminal wires to the conductor carrier can be performed because of the advantageous multiple use of each printed conductor configuration.

Another possibility of reducing the setting current in a printed conductor consists of applying an external supporting field of the strength $H_z$. The supporting field should be parallel or antiparallel to the setting field $H_e$ generated by the respective printed conductor part. Supporting field $H_z$ and setting field $H_e$ then make it possible to exceed, when necessary, a predetermined threshold of the field strength of the magnetic field to which the bias layer part of the GMR multi-layer system is exposed. Corresponding field conditions, such as those typical of a bias layer or a system of an artificial antiferromagnet (see German Published Patent Application No. 42 43 358) are apparent from the diagram in FIG. 4. The diagram shows field strength H plotted on the abscissa and magnetization M plotted on the ordinate in arbitrary units. For the hysteresis curve shown in FIG. 4, variable $H_s$ represents a threshold field strength, which may be the saturation field strength according to the assumed embodiment, $H_c$ represents the coercive field strength (which is established by the interconnection of the hysteresis curve and the field strength axis H, as described in H. Burke, "Handbook of Magnetic Phenomena," Van Nostrand Reinhold Company, page 64, 1986) and $H_k$ represents the field strength at which magnetization M begins to increase suddenly from the value of the negative saturation magnetization with an increase in field strength. $H_z$ is selected to be approximately equal to $(H_k+H_s)/2$. The sum of the absolute values of $H_z$ and setting field $H_e$ is greater than saturation field strength $H_s$, while $\|H_z\|-\|H_e\|$ is smaller than $H_k$. $H_z$ and $H_e$ have parallel orientations. The direction of $H_z$ may also be reversed for setting. Accordingly, in a first setting phase, $H_e$ and $H_z$ on printed conductors $L_1$ and $L_4$ (according to FIG. 2) would be directed in the same direction, and the bias layer magnetization is set in respective sensor elements $E_1$ and $E_4$. However, the field $|H_z|-|H_e|$ in the other elements $E_2$ and $E_3$ is too low to affect the bias layer magnetization in these elements. With the opposite $H_z$, the roles of the pairs of elements $E_1$–$E_4$ and $E_2$–$E_3$ are reversed, so that elements $E_2$ and $E_3$ are magnetized in the opposite directions. When $H_k$=$H_s/2$ and $H_e$≈$1.1*(H_s-H_k)/2$, the setting current intensity is reduced by a factor of 1.1:4. With the same printed conductor geometry, the heat generated is then lower by a factor of 1:9.

With some multi-layer systems, in particular "exchange-biased systems" with a bias layer part consisting of a NiFe layer with an FeMn backing (see, for example, European Patent No. 346,817), it may be advantageous to expose the layer system to elevated temperature conditions during magnetization of its bias layer part. Thus, for example, a temperature increase to approximately 150° C. is advantageous for the above-mentioned FeMn layer of the layer system. A corresponding temperature increase can be accomplished by arranging the layer system in a heated space using a heating arrangement 30 shown in FIG. 5 (e.g., a heating device, a temperature elevating arrangement, etc.).

Figure 4:
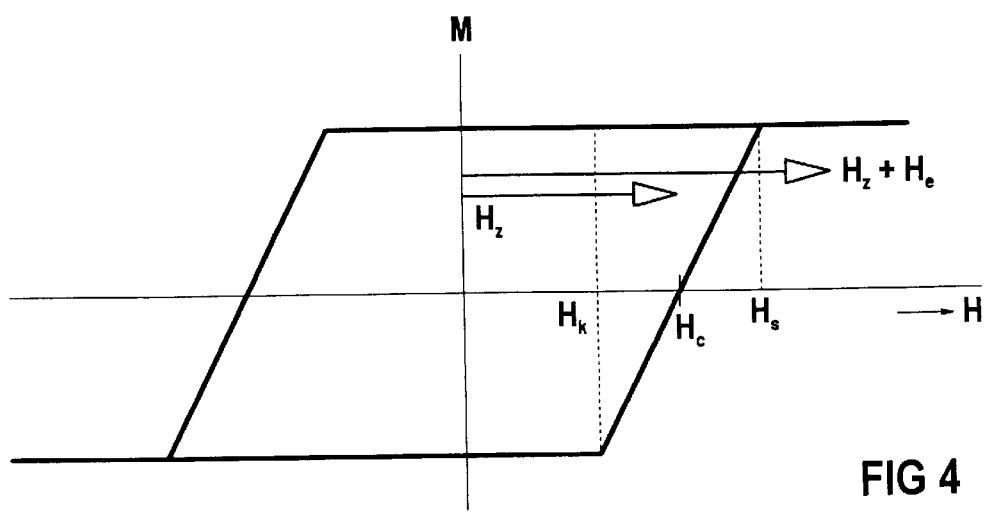
FIG. 4 shows the hysteresis curve of a bias layer part of a sensor element.

According to the embodiment represented by the diagram in FIG. 4, an external supporting magnetic field with a field strength $H_z$ is selected so that it alone is not sufficient to exceed threshold field strength $H_s$. It is also possible to provide a correspondingly high supporting magnetic field and then, the setting field of a printed conductor of the magnetizing device according to this invention, create an opposing field that reduces the supporting field accordingly.

Figure 5:
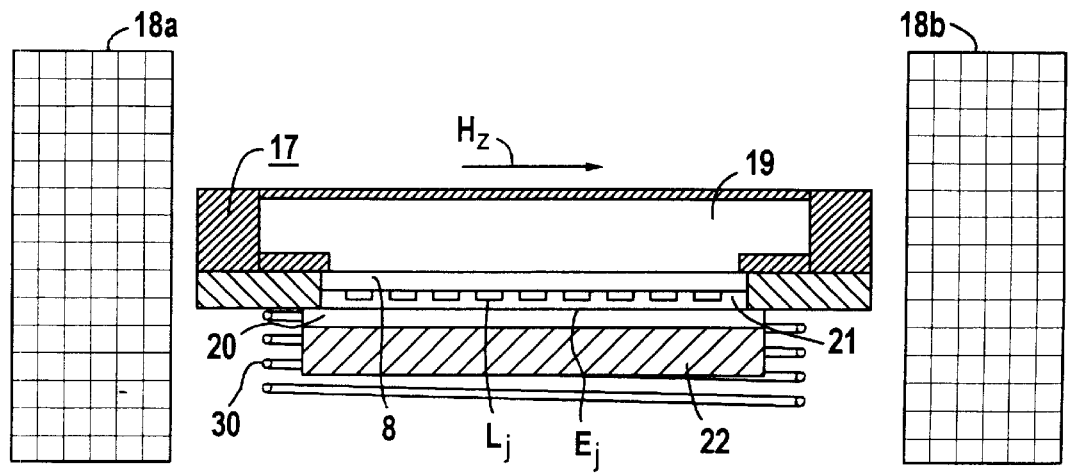
FIG. 5 shows a magnetizing device based on the hysteresis curve.

FIG. 5 shows the essential parts of a device according to the present invention for setting the bias layer magnetization of several GMR sensor elements. The structure of the device, which is designated in general as 17, resembles that of optical contact exposure systems used in the microstructure technology. The distinguishing features of the magnetizing device according to the present invention in comparison with these systems shall be discussed below. In FIG. 5, 18a and 18b indicate a magnetic field source, 19 is a cooling chamber, 20 is a sensor substrate with GMR sensor elements $E_j$ (indicated in FIG. 5) arranged on it, 21 is an interspace that can be deaerated, and 22 is a device for positioning sensor substrate 20 with regard to a conductor carrier 8 having printed conductors $L_j$. According to the embodiment of the present invention shown in FIG. 5, the field source to generate the additional field $H_z$ may be provided in the form of permanent magnets 18a and 18b with printed conductors $L_j$ and the respective sensor elements $E_j$ running between their magnetic poles. A field reversal can be accomplished, for example, by rotating the entire magnet system about an axis perpendicular to the field of printed conductors $L_j$. However, two separate magnetic field areas may be provided with opposite field directions into which the structure with the conductor carrier and the sensor substrate can be introduced consecutively. Electric magnetic field coils surrounding the conductor carrier and the respective sensor substrate, for example, are of course also suitable for generating field $H_z$.

Figure 6:
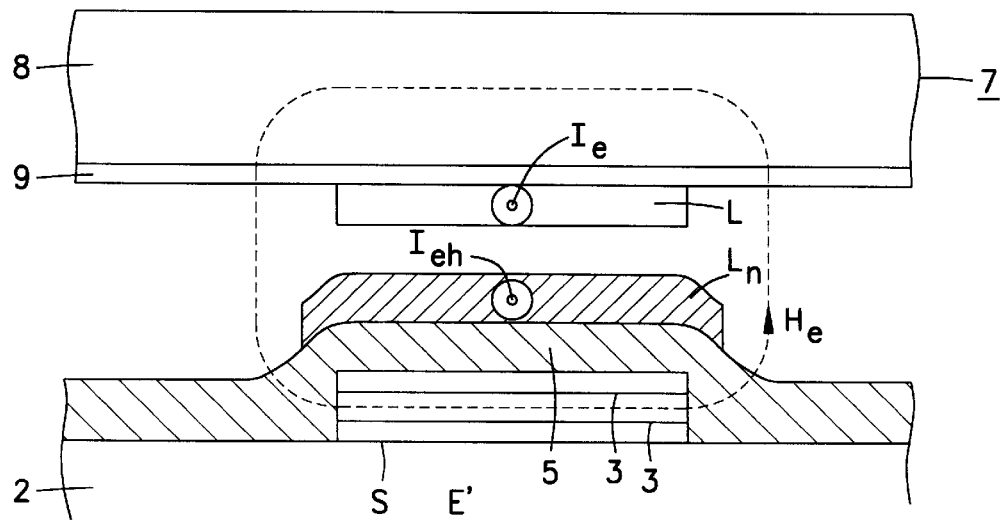
FIG. 6 shows an embodiment of a magnetizing device.

As another measure for reducing setting current $I_e$ in the at least one conductor, it is possible to provide a partial piece of at least one auxiliary conductor on or in the at least one sensor element to be magnetized, to generate a portion of the magnetic field required to magnetize the at least one bias layer part. A corresponding embodiment of the present invention is shown in FIG. 6, which is based on the embodiment according to FIG. 1. Sensor element E' shown here differs from sensor element E according to FIG. 1 practically only in that on its side facing printed conductor part L of magnetizing device 7, it has an auxiliary printed conductor part $L_h$ of a material which conducts electricity well and over which a predetermined auxiliary setting current $I_{eh}$ is to be carried. Thus, partial fields that overlap to form a magnetic field of strength $H_e$ can be generated by printed conductor part L and auxiliary printed conductor part $L_h$ to achieve the desired magnetization conditions in bias layer part 3 of sensor element E'. Currents $I_e$ and $I_{eh}$ need not necessarily be of the same type with regard to polarity reversal. For example, a direct current may be provided for printed conductor part L and an alternating current for auxiliary printed conductor part $L_h$.

It is possible to combine the embodiment of a magnetizing device according to this invention indicated in FIG. 6 with measures generating a supporting magnetic field according to FIGS. 4 and 5.

With a magnetizing device according to the present invention, it may be expedient to provide an interspace 21 that can be deaerated to keep the distance between a sensor substrate 20 and a conductor carrier 8 small enough over the entire contact area. To generate a vacuum, for example, the air is pumped out from the interspace. Thus, the requirements for spacing D between the conductor carrier and the sensor substrate can be met relatively easily, with D being on the order of 10 $\mu$m. Problems can occur only with sensor elements having very small lateral dimensions and with uneven sensor substrates. In this case, flexible carriers and/or sensor substrates can be used. The vacuum in interspace 21 ensures that the conductor carrier and the sensor substrate conform to each other in shape.

Figure 7:
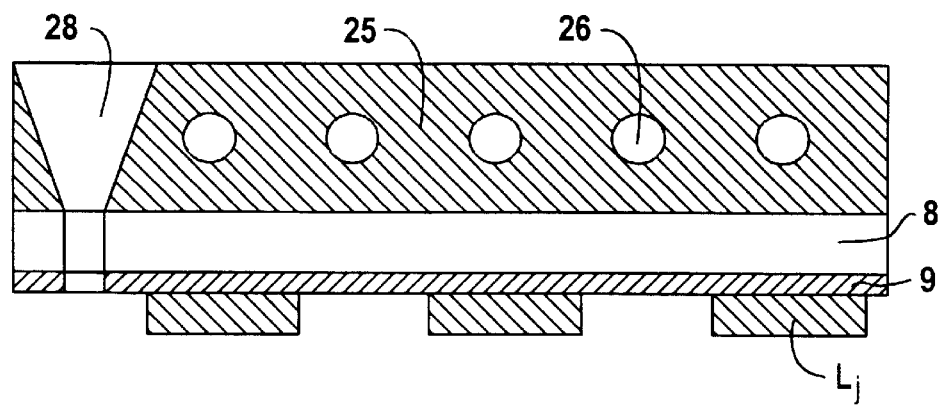
FIG. 7 shows another embodiment of a magnetizing device.

In addition, cooling of conductor carrier 8 is also advantageous. According to FIG. 5, the cooling of the printed conductor carrier 8 can be accomplished with cooling space 19 through which a liquid or gaseous cooling medium can be carried. In addition or instead, a heat sink with a large thermal capacity is also suitable for dissipation of heat. A corresponding embodiment of the present invention is shown in FIG. 7, according to which a heat sink 25 is mounted on a conductor carrier 8 on its side facing away from a plurality of conductors $L_j$ and may also be provided with cooling ducts 26 to carry a coolant. As FIG. 7 shows, heat sink 25 has an adjusting hole 28. The adjusting hole 28 allows the heat sink or the conductors connected to it to be optically adjusted with regard to a suitable mark on the surface of a sensor substrate. Similar optical methods are used in the microstructure technology to position a contact mask, usually transparent, with regard to a wafer. Adjusting hole 28 is necessary in this case because of heat sink 25 and printed conductor carrier 8, which is generally non-transparent. The positioning accuracy here need not meet the customary requirements in the microstructure technology. Therefore, other non-optical methods such as electric contacts may be used for adjustment.

What is claimed is:

1. A device for setting a fixed predetermined magnetization distribution in a bias layer of at least one magneto-resistive sensor element, the at least one sensor element including a thin-film structure situated on a substrate and having a giant magneto-resistive effect, the bias layer having a predetermined direction of orientation of magnetization, the device comprising:

at least one electrically conducting conductor part;

a positioning arrangement for positioning the at least one conductor part relative to the at least one magneto-resistive sensor element in a detachable manner; and a current carrying arrangement for carrying a predetermined current in the at least one conductor part to generate at least a portion of a magnetic field, the current carrying arrangement fixably setting the magnetization in the bias layer of a respective sensor element of the at least one magneto-resistive sensor element in the predetermined direction of the orientation.

2. The device according to claim 1, wherein a single conductor part is provided for a plurality of magneto-resistive sensor elements.

3. The device according to claim 2, wherein the at least one conductor part includes a plurality of conductor parts, the conductor parts being provided for the plurality of magneto-resistive sensor elements.

4. The device according to claim 1, wherein the at least one conductor part has a width to at least approximately cover the area of at least one corresponding magneto-resistive sensor element.

5. The device according to claim 1, wherein the at least one conductor part is arranged at an angle which is different from zero relative to a longitudinal direction of the at least one corresponding magneto-resistive sensor element.

6. The device according to claim 1, further comprising:

a heating arrangement for elevating temperature conditions when magnetizing the bias layer of the at least one magneto-resistive sensor element.

7. The device according to claim 1, wherein a polarity of the predetermined current reverses periodically.

8. The device according to claim 1, wherein the at least one conductor part is composed of a material that is a good electrical conductor.

9. The device according to claim 1, wherein the at least one conductor part is attached to a conductor carrier.

10. The device according to claim 9, wherein the conductor carrier is made of a material that is a good heat conductor to dissipate heat generated by the at least one conductor part via a thermal conduction over the conductor carrier.

11. The device according to claim 9, further comprising:

a cooling arrangement for cooling the conductor carrier.

12. The device according to claim 11, wherein the conductor carrier is connected, on the side of the conductor carrier further away from the at least one conductor part, to a heat sink with cooling ducts for a coolant.

13. The device according to claim 9, further comprising:

an adjusting arrangement for adjusting the conductor carrier to be above the at least one magneto-resistive sensor element.

14. The device according to claim 1, wherein the predetermined magnetization distribution of the bias layer is created using the predetermined current in the at least one conductor part which is provided for the at least one magneto-resistive sensor element.

15. A system, comprising:

a device setting a fixed predetermined magnetization distribution in a bias layer of at least one magneto-resistive sensor element, the bias layer having a predetermined direction of orientation of magnetization, the device including:

at least one electrically conducting conductor part, a positioning arrangement for positioning the at least one conductor part relative to least one magneto-resistive sensor element in a detachable manner, and a current carrying arrangement for carrying a predetermined setting current in the at least one conductor part to generate at least a portion of a magnetic field, the current carrying arrangement fixably setting the magnetization in a bias layer of a respective sensor element of the at least one magneto-resistive sensor element in the predetermined direction of the orientation, wherein at least one electrically conducting auxiliary conductor unit is fixably connected to the at least one magneto-resistive sensor element and a portion of the magnetic field required for the magnetization of the bias layer part is generated using a predetermined auxiliary current in the auxiliary conductor part.

16. The system according to claim 15, wherein a magnetic field source creates a supporting field, wherein the at least one sensor element is exposed to the supporting field, and wherein the magnetic field has such a strength that the supporting field forms part of the magnetic field required to magnetize the bias layer part.

17. A system, comprising:
   a device setting a fixed predetermined magnetization distribution in a bias layer of at least one magneto-resistive sensor element, the bias layer having a predetermined direction of an orientation of a magnetization, the device including:
      at least one electrically conducting conductor part,
      a positioning arrangement for positioning the at least one conductor part relative to least one magneto-resistive sensor element in a detachable manner, and
      a current carrying arrangement for carrying a predetermined setting current in the at least one conductor part to generate at least a portion of a magnetic field, the current carrying arrangement fixably setting the magnetization in a bias layer of a respective sensor element of the at least one magneto-resistive sensor element in the predetermined direction of the orientation, wherein a magnetic field source creates a supporting field, wherein the at least one sensor element is exposed to the supporting field, and wherein the magnetic field has such a strength that the supporting field forms part of the magnetic field required to magnetize the bias layer part.

18. The device according to claim 1, wherein the magnetization distribution is set only once and permanently in the bias layer.

19. The device according to claim 1, wherein the thin-film structure includes a measurement layer which is magnetically softer than the bias layer and which is separated from the bias layer by a non-magnetic intermediate layer.

* * * * *